United States Patent [19]

Kawatani

[11] Patent Number: 4,733,462

[45] Date of Patent: Mar. 29, 1988

[54] APPARATUS FOR POSITIONING CIRCUIT COMPONENTS AT PREDETERMINED POSITIONS AND METHOD THEREFOR

[75] Inventor: Norio Kawatani, Kanagawa, Japan

[73] Assignee: Sony Corporation, Tokyo, Japan

[21] Appl. No.: 867,926

[22] Filed: May 29, 1986

[51] Int. Cl.⁴ .................... H05K 3/34; B23P 19/00
[52] U.S. Cl. ................................. 29/840; 29/759;
29/834; 228/49.1; 269/21; 269/309; 269/903;
294/64.1; 361/404; 361/405
[58] Field of Search ............... 29/840, 834, 740, 759;
228/49.1, 180.2; 361/400, 404, 405; 269/21,
309, 310, 903; 294/64.1

[56] References Cited

U.S. PATENT DOCUMENTS

| | | |
|---|---|---|
| 3,083,291 | 3/1963 | Soffa et al. ............... 29/740 X |
| 3,479,716 | 11/1969 | Zanger, Jr. et al. ............ 29/740 |
| 3,559,279 | 2/1971 | Miklaszewski .............. 29/740 X |
| 3,889,337 | 6/1975 | Shughart . |
| 3,938,245 | 2/1976 | Lovendusky . |
| 4,283,845 | 8/1981 | Sigel et al. ................. 29/740 X |
| 4,393,579 | 7/1983 | Van Hooreweder .......... 29/740 |

Primary Examiner—Howard N. Goldberg
Assistant Examiner—Carl J. Arbes
Attorney, Agent, or Firm—Ronald P. Kananen

[57] ABSTRACT

An apparatus for positioning circuit components such as flat package IC's at predetermined positions of a printed circuit board and a method therefor are disclosed. In the apparatus, a guide body is provided on the printed circuit board and a positioning member is installed on a retainer plate which holds one of the circuit components. The guide portion guides the positioning member to a point where the component coincides with the predetermined position.

31 Claims, 11 Drawing Figures

APPARATUS FOR POSITIONING CIRCUIT COMPONENTS AT PREDETERMINED POSITIONS AND METHOD THEREFOR

BACKGROUND OF THE INVENTION

The present invention relates to an apparatus for positioning circuit components and more specifically relates to an apparatus for positioning circuit components at predetermined positions in order to mount the components on printed circuit boards.

In order to fabricate electronic circuits, selected electronic parts are generally mounted on a printed circuit board. In this case, it is necessary to arrange these electronic parts at predetermined positions on the printed circuit board. Conventionally, a hole is formed in the printed circuit board as a reference and the hole is utilized to position the printed circuit board mechanically so that each circuit component can be mounted on the board at points defined relative to the outline of the printed circuit board.

However, this conventional technique for positioning and mounting electronic components on printed circuit boards has resulted in large errors due to the effective accuracy of the hole punched through the board relative to the printed patterns, the printing accuracy of the printed patterns, and deformation of the printed circuit board caused by the heat generated when the board is dipped in molten solder. In addition, due to such factors as the material and configuration of the printed circuit board, it is impossible to mount electronic components on the printed circuit board in this way with high accuracy. In cases where electronic components having a great number and density of lead legs as in the case of flat package IC's, the lead legs are not always correctly connected to corresponding connection patterns so that highly reliable component mounting cannot be achieved.

Hence, the mounting of high-density electronic components depends on manual labor. However, productivity is quite poor in the case of manual operations and production costs increase accordingly.

To cope with these problems, pattern recognition techniques may be adopted to position electronic components on printed circuit boards. In this case, productivity and cost are still in question and these techniques are not put into practice.

A Japanese Utility Model Application Unexamined Open No. Sho 59-61571 has proposed that to position electronic components such as flat package IC's on the printed circuit board, the lead legs of the electronic components be directly fitted into recessed parts of solder dips. However, this technique cannot be applied to components with coplanar or low-angle lead legs. In addition, it cannot cope with components with deformed terminals. Furthermore, it is not practical and hardly worthwhile to form recesses in solder bosses on the printed circuit board for each lead leg of each electronic component to be connected to a printed circuit pattern.

SUMMARY OF THE INVENTION

With the above-described problems in mind, it is an object of the present invention to provide an apparatus for positioning circuit components at predetermined positions and a method therefor which facilitate automatic mounting of the circuit components and which improve the mounting accuracy of the circuit components without the influence of the dimensional accuracy or material of printed circuit boards.

The above-described object can be achieved by providing an apparatus for positioning circuit components at predetermined positions comprising: (a) a printed circuit board; (b) at least one component which is to be mounted at a predetermined position on the printed circuit board; (c) means for releasably holding the component; (d) a positioning member installed on the holding means; and (e) a guide body at a known point on the printed circuit board, the guide body serving to guide the positioning member to a known position with respect to the printed circuit board, whereupon the holding means releases the component onto a predetermined point on the printed circuit board.

This can also be achieved by an apparatus comprising: (a) first means for grasping a circuit component; (b) a positioning member installed on the first means in a first positional relationship with the grasped circuit component; (c) second means for moving the first means and the positioning member toward a printed circuit board; and (d) third means formed on the printed circuit board for guiding the positioning member into a reference position of the printed circuit board when the positioning member is brought into contact therewith so that the grasped circuit component is positioned at a predetermined position of the printed circuit board at which the grasped circuit component is to be installed, the predetermined position being in a second positional relationship with the reference position which is equal to the first positional relationship.

This can also be achieved by a method for positioning circuit components at predetermined positions on a printed circuit board comprising the steps of:

(a) grasping one circuit component in a first positional relationship with a positioning member;

(b) providing a convex body at a reference position on the printed circuit board; and (c) placing the positioning member on the convex body so that the positioning member is guided to the reference position and the grasped circuit component is positioned at a predetermined position of the printed circuit board on which the circuit component is to be installed, the predetermined position having a second positional relationship with the reference position equal to the first positional relationship.

BRIEF DESCRIPTION OF THE INVENTION

A more complete understanding of the present invention may be obtained from the following detailed description taken in conjunction with the attached drawings in which.

DETAILED DESCRIPTION OF THE PREFERRED EMBODIMENTS

Reference will hereinafter be made to the drawings in order to facilitate understanding of the present invention.

Figure 1:
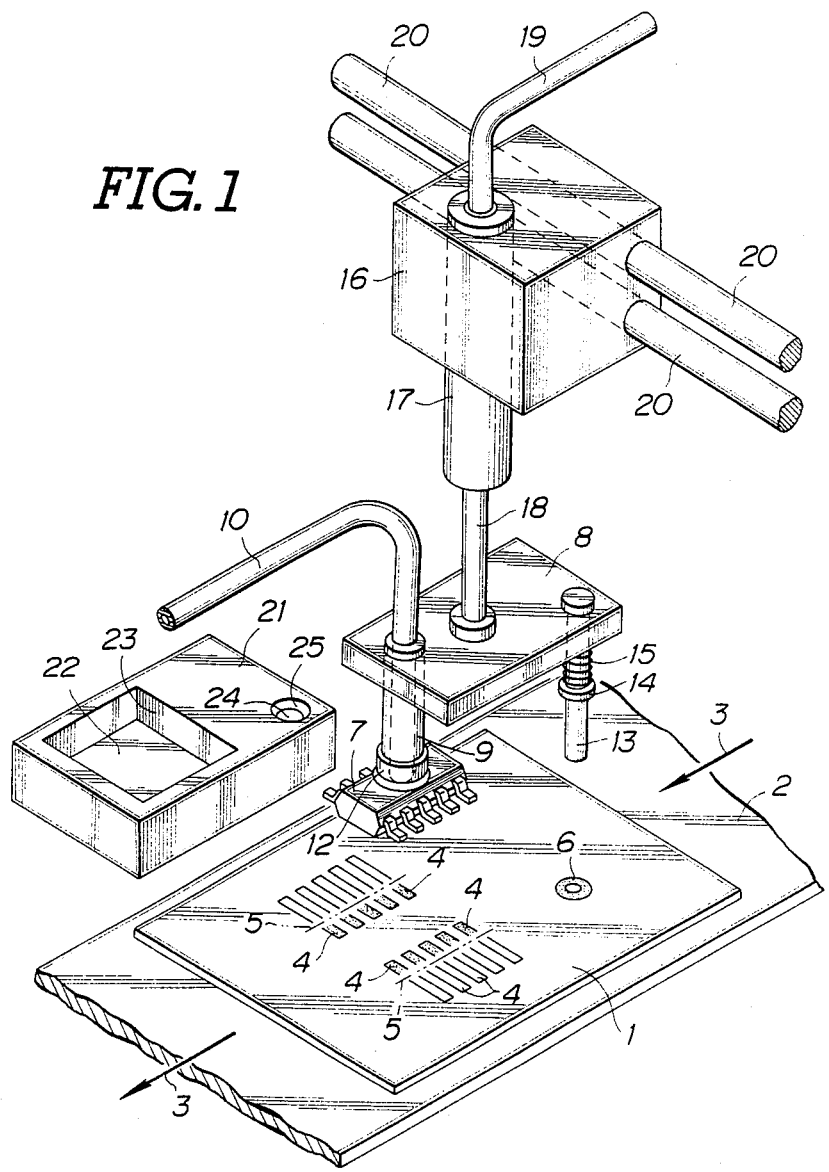
FIG. 1 is a perspective view of an apparatus for positioning circuit components in a preferred embodiment according to the present invention.

FIG. 1 shows a preferred embodiment of an apparatus for positioning circuit components according to the present invention. The apparatus shown in FIG. 1 is used to mount electronic components on a printed circuit board 1. The printed circuit board 1 is arranged on conveying means 2, e.g., a belt conveyor which is intermittently moved in a convey direction denoted by an arrow mark 3. The printed circuit board 1 is formed with conductive printed patterns which connect related circuit components. The free ends 4 of the area at the printed patterns marked off by the dot-and-dash lines 5 are susceptible to soldering since they are not covered by a resist material which covers the rest of the area at the printed pattern on the other side of the dot-and-dash lines 5.

A ring-shaped guide 6 is made of a small body of solder on the printed circuit board 1. This guide 6 is used to position the circuit components and is formed by soldering a separate conductive pattern onto the printed circuit board. Specifically, first a ring-shaped conductive pattern 26 (refer to FIG. 2 and FIG. 3) is formed and thereafter the board is dipped in solder to form the ring-shaped guide on the printed circuit board 1.

A flat package IC 7 to be mounted on the printed circuit board 1 so that its pins can be connected to the solder terminal 4 is held on a retainer plate 8. The retainer plate 8 is provided with a frame 9, the frame 9 being connected to a suction pipe 10. Furthermore, a suction pad 12 is attached to the tip of the frame 9 so that the package IC 7 is retained by means of vacuum suction. In addition, a positioning pin 13 is slidably retained on the retainer plate 8. A coil spring 15 is seated between a flange 14 of the pin 13 and the retainer plate 8 so as to press the positioning pin 13 downward.

The retainer plate 8 which holds the flat package IC 7 by means of vacuum suction is, then, supported on a travel block 16 via a pneumatic actuator 17. The pneumatic actuator 17 has a piston rod 18 fixed to the above-described retainer plate 8. The pneumatic actuator 17 is connected to an air pipe 19 which is connected to a source (not shown) of compressed air. A pair of guiding rods 20 penetrate the travel block 16 so that the travel block 16 is free to slide therealong.

An IC alignment unit 21 is arranged to one side of the printed circuit board 1 on the conveyor 2. The IC alignment unit 21 is provided with a recess 22 for the package IC 7, the recess 22 having an inclined side wall 23. In addition, the alignment unit 21 is provided with a circular hole 24 for positioning purposes, the upper surface of which has an inclined inlet 25.

The positioning operation performed by the positioning apparatus will be described below.

Figure 2:
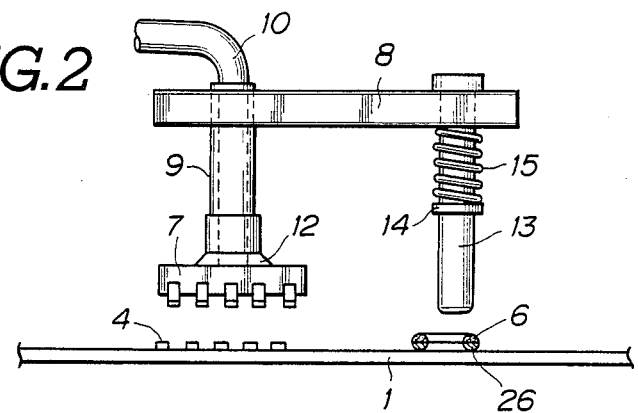
FIG. 2 is a front view of an essential part of the apparatus shown in FIG. 1.
Figure 4:
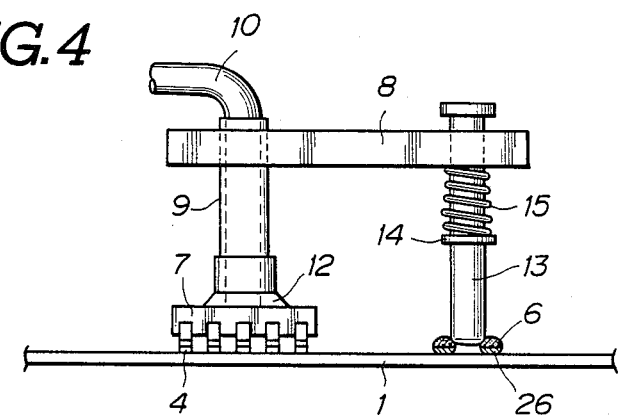
FIG. 4 is a front view of the essential part shown in FIGS. 1 through 3 following completion of the guiding operation.

The suction pad 12 holds the flat package IC 7 firmly as shown in FIG. 2 by means of the pressure provided via the suction pipe 10. It should be noted that the flat package IC 7 is previously set so that the positional relationship between the positioning pin 13 and the IC 7 is equal to that between the solder terminal 4 of the printed circuit board 1 and the guide 6. In this state, the travel block 16 is moved along the pair of rods 20. When the block 16 reaches a predetermined position, the pneumatic actuator 17 is activated to extend the piston rod 18. As a result, the retainer plate 8 is driven downward as shown in FIG. 2 and FIG. 4.

Figure 3:
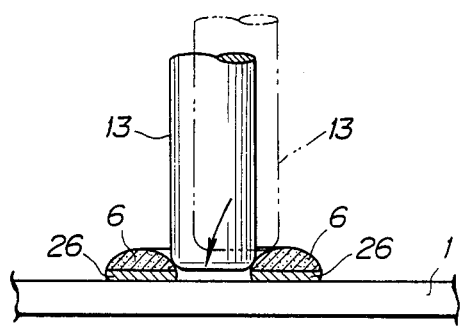
FIG. 3 is an enlarged front view of an essential part of the apparatus shown in FIGS. 1 and 2 for explaining the guiding operation of a positioning pin.

The positioning pin 13 installed on the retainer plate 8 is pressed downward by means of a spring 15 so that the tip of the pin 13 is brought into contact with the printed circuit board 1 before the flat package IC 7. Hence, as the retainer plate 8 is lowered by the actuator 17, the pin 13 comes into contact with the ring-shaped guide 6 as shown in FIG. 3 and is driven toward the center of the guide 6 by the incline on the inner peripheral edges of the guide 6. The pin 13 slides along the solder guide 6 and is received in the space enclosed by the guide 6 as it moves from the position denoted by dot-and-dash lines to the position denoted by the solid lines in FIG. 3.

This series of steps permits the positioning of the retainer plate 8 so that the flat package IC 7 correctly coincides with the solder terminal 4. As the retainer plate 8 is lowered further by the pneumatic actuator 17, the retainer plate 8 moves downward with respect to the positioning pin 13 as shown in FIG. 4. Consequently, the flat package IC 7 held on the retainer plate 8 by the suction pad 12 can be properly positioned on the solder terminal 4.

The lead legs of the package IC 7, once properly positioned, are permanently electrically connected with adhesive or solder to the solder terminal 4. At the same time, the vacuum suction is released via the absorbing pipe 10 to release the flat package IC 7 from the suction pad 12 and, at the same time, the pneumatic actuator 17 retracts the piston rod 18. Hence, the retainer plate 8, now free of the flat package IC 7, moves upward. Then, the retainer plate 8 moves to a point above the IC alignment unit 21 by moving the block 16 along the pair of rods 20.

The next flat package IC 7 to be installed is held by the above-described alignment unit 21 and picked up by the retainer plate 8. This operation will be described below with reference to FIG. 5 and FIG. 6.

Once the retainer plate 8 is above the alignment unit 21, the piston rod 18 is again extended in response to the activation of the pneumatic actuator 17.

Figure 5:
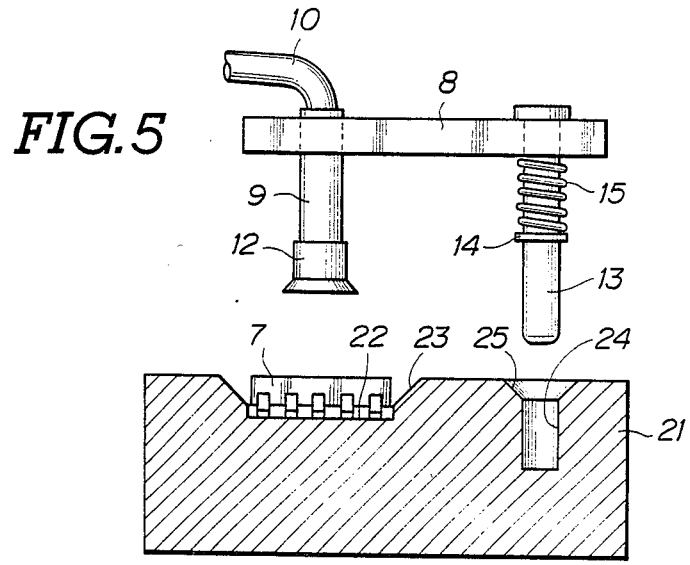
FIG. 5 is a longitudinal section through an IC alignment unit.
Figure 6:
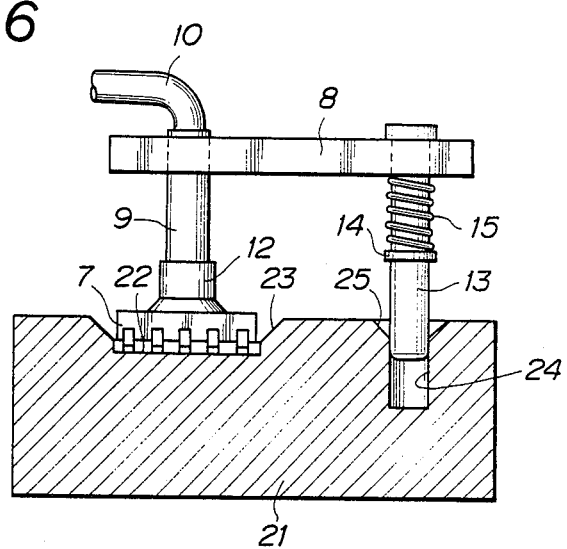
FIG. 6 is another longitudinal section through an IC alignment unit.

Then, the position of the retainer plate 8 is changed from the state shown in FIG. 5 to that shown in FIG. 6 and the positioning pin 13 of the retainer plate 8 is fitted into the circular positioning hole 24 of the alignment unit 21. At this time, the slanted inlet 25 helps guide the positioning pin into the hole 24. Furthermore, the suction pad 12 on the tip of the frame 9 of the retainer plate 8 is pressed against the flat package IC 7 held in place within the recess 22.

Hence, the flat package IC 7 is correctly positioned with respect to the positioning pin 13 and in this state, suction is applied out via the suction pipe 10 so that the flat package IC 7 is grasped by the retainer plate 8. As a result, the system is ready to perform the next mounting operation.

As described above, the embodiment of the parts positioning apparatus can mount the package IC 7 on the printed circuit board 1 with an accuracy determined by the terminals 4 and the pattern 26. A highly accurate positioning is possible if sufficient care is taken with regard to the positional relationship between the positioning pattern 26 and the solder terminal 4.

Thus, circuit components 7 can be properly mounted at the required point on the printed circuit board 1 independent of the dimensional accuracy, material, or configuration of the printed circuit board 1.

According to the mounting method described above, automatic mounting of flat package IC's 7 on the printed circuit boards can be achieved. Furthermore, no skill is required for the mounting operation of the circuit components and productivity of the mounting of the components can be enhanced.

The mounting accuracy is improved by this part-positioning apparatus so that quality and reliability of electronic circuits formed on printed circuit boards are also improved. Since the mounting of the individual circuit components is carried out at the same time when the positioning of the individual circuit components is carried out, the productivity can be improved remarkably. It should be noted that the printed circuit board has the same configuration as conventional boards so that the cost of the printed circuit board 1 itself will not be increased. In addition, this mounting method makes high-density mounting of circuit components possible as well as the positioning of a plurality of parts by means of a single positioning guide 6. Automatic mounting of flat package IC's 7 with closely spaced lead legs is also possible.

Figure 7:
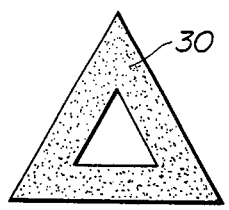
FIGS. 7 through 10 are plan views of modifications to the guide shown in FIG. 1.
Figure 8:
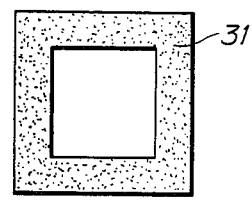
Figure 9:
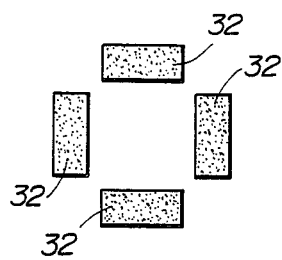
Figure 10:
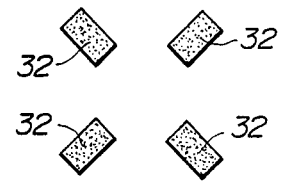

Although the solder guide 6 is ring-shaped in this embodiment, the guide for the positioning pin 13 need not always be circular but may be triangular as shown in FIG. 7 or alternatively may be square as shown in FIG. 8. Alternatively, rectangular guide portions 32 may be arranged so as to define a square, as shown in FIG. 9. In another alternative shown in FIG. 10, four rectangular guide portions 32 may be arranged radially.

Figure 11:
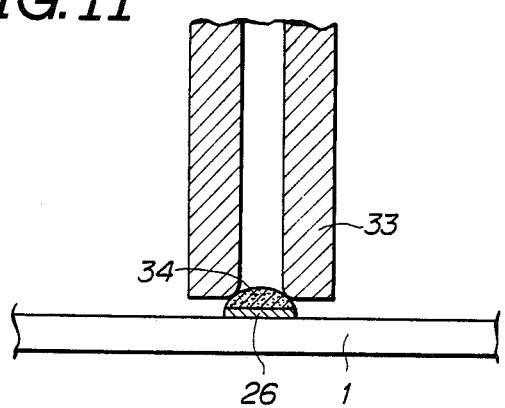
FIG. 11 is a longitudinal section through another modification of the guide and positioning pin.

Although the positioning pin 13 in the above-described embodiment is solid, it is possible to use a hollow cylindrical positioning pin 33, as shown in FIG. 11. In this case, the inner edges of the positioning pin 3 are used to center the pin 33 over a spot-shaped guide body 34.

As described hereinabove, the apparatus for positioning electronic components at predetermined positions can mount components on printed circuit boards with high accuracy with the aid of a simple guide body comprising a highly accurate projection made of solder and without the influence of the dimensional accuracy, material, or configuration of the printed circuit boards. Furthermore, the automatic mounting operation can be achieved without skilled labor.

It will be fully understood by those skilled in the art that the foregoing description is made in terms of the preferred embodiment and various changes and modifications may be made without departing from the scope of the present invention which is to be defined by the appended claims.

What is claimed is:

1. An apparatus for positioning circuit components at predetermined points, comprising:
   (a) means for releasably holding at least one component which is to be mounted at a predetermined position on a printed circuit board;
   (b) a positioning member installed on the holding means; and
   (c) means for transferring and placing the positioning member into a guide body at a known point on the printed circuit board, the guide body serving to guide the position member to a known position with respect to the printed circuit board, the guide body defining a recess and including a conductive pattern on which solder is deposited, and the positioning member including a bar whose tip is so formed as to be received in the recess defined by the guide body.

2. The apparatus according to claim 1, wherein the conductive pattern is in the form of a ring on which solder is deposited and the tip is rounded and is receivable in the recess defined by the guide body.

3. The apparatus according to claim 1, wherein the conductive pattern is in the form of a circle, and the bar has a hollow-cylindrical tip defining inner edges tapered to match the circular shape of the guide body.

4. An apparatus comprising:
   (a) first means for grasping a circuit component;
   (b) second means for supporting said first means;
   (c) a positioning member installed on said first means in a first positional relationship with the first means;
   (d) third means for moving said first means and said positioning member toward a printed circuit board; and
   (e) fourth means formed on the printed circuit board for guiding said positioning member into a reference position of the printed circuit board when said positioning member is brought into contact with said fourth means so that the grasped circuit component is positioned at a predetermined position of the printed circuit board at which the grasped circuit component is to be installed, said predetermined position being in a second positional relationship with said reference position which is equal to the first positional relationship.

5. The apparatus according to claim 4, wherein said first means grasps the circuit component by means of vacuum suction.

6. The apparatus according to claim 4, wherein said first means comprises a frame with a pad at one end which releasably grasps the circuit component in the first positional relationship with the positioning member and a plate fixed to said frame and arranged so that the frame and positioning member are in a fixed positional relationship.

7. The apparatus according to claim 4, wherein said fourth means comprises a conductive pattern surrounding said reference position and a convex body made of solder formed on said conductive pattern and said positioning member has slanted edges at one end thereof so that when the slanted edges of the positioning member are brought into contact with the inner surface of the convex body, the positioning member being guided to the reference position.

8. The apparatus according to claim 7, wherein said conductive pattern is circular.

9. The apparatus according to claim 7, wherein said conductive pattern is triangular.

10. The apparatus according to claim 7, wherein said conductive pattern is square.

11. The apparatus according to claim 7, wherein said conductive pattern comprises four rectangular strips arranged around said reference position so as to form a square.

12. The apparatus according to claim 7, wherein said conductive pattern comprises four rectangular pattern strips arranged radially symmetrically around said reference position.

13. The apparatus according to claim 4, wherein said fourth means comprises a conductive pattern located at the reference position and convex body made of solder formed on said conductive pattern and said positioning member has a hole in the center of one end thereof, said hole having slanted inner edges so that when the slanted edges of said hole of said positioning member are brought into contact with the convex body, the positioning member is guided to the reference poistion.

14. An apparatus for mounting an electronic component on a printed circuit board formed with conductive printed patterns which connect related circuit components, at least one of said patterns defining a location for receiving said component, comprising:
   guide means on said printed circuit board spaced at a predetermined location relative to said component-receiving location for positioning said circuit component;
   means for conveying said circuit component from a location remote from said printed circuit board to said printed circuit board, said conveying means including a positioning member and means for releasably retaining said circuit component at a location relative to said positioning member;
   said guide means and said positioning member cooperating to locate said circuit component retained on said retaining means for precise release to said predetermined location, the spacing of said guide means relative to said predetermined location being equal to the spacing between said positioning member and said circuit component on said retaining means.

15. The combination as set forth in claim 14, wherein said guide means is a guide member having a shape structurally adapted to cooperate with said positioning member therein.

16. The combination as set forth in claim 14, wherein said guide member comprises a ring-shaped body of solder on the printed circuit board and includes a ring-shaped conductive pattern.

17. The combination as set forth in claim 14, wherein:
   said conveying means includes a retainer plate for holding said retaining means; and
   said positioning member comprises a positioning pin slidably retained on said retainer plate.

18. The combination as set forth in claim 17 further including:
   an alignment unit for holding said electronic component for pickup by said retainer plate and said releasably securing means; and
   a positioning opening in said alignment unit for receiving said positioning pin on said retainer plate for correctly positioning said electronic component relative to said positioning pin.

19. An apparatus comprising:
   (a) first means for grasping a circuit component;
   (b) second means for supporting said first means;
   (c) a positioning member mounted on said first means in a first positional relationship with respect to the first means; and
   (d) third means for bringing said positioning member into a reference position relative to the printed circuit board in contact with means formed on the printed circuit board for guiding the positioning member into the reference position, whereby a circuit component grasped by said first means is positioned at a predetermined position on the printed circuit board, the reference position being in a second positional relationship with respect to the predetermined position which is equal to the first positional relationship of the positioning member with respect to the first means.

20. A method for positioning circuit components at predetermined positions on a printed circuit board comprising the steps of:
   (a) grasping one circuit component in a first positional relationship relative to a positioning member;
   (b) providing a convex body at a reference position on the printed circuit board; and
   (c) placing the positioning member on the convex body so that the positioning member is guided to the reference position and the grasped circuit component is positioned at a predetermined position of the printed circuit board on which the circuit component is to be installed, said predetermined position having a second positional relationship relative to the reference position which is equal to the first positional relationship.

21. The method according to claim 20, wherein the steps of providing a convex body comprises forming a conductive pattern in the form of a ring on the printed circuit board, and depositing solder on the ring to define a recess; and
   the step of placing the positioning member comprises moving a bar having a rounded tip into the recess.

22. The method according to claim 20, wherein the step of providing a convex body comprises forming a conductive pattern in the form of a circle on the printed circuit board, and depositing solder on the ring; and
   the step of placing the positioning member comprises moving a bar having a hollow-cylindrical tip defining inner edges tapered to match the shape of the circle into contact with the circle.

23. The method according to claim 20, wherein the step of grasping comprises grasping the circuit component by means of suction.

24. The method according to claim 20, wherein the step of grasping comprises releasably grasping the circuit component by means of a pad.

25. The method according to claim 20, wherein the step of providing a convex body comprises surrounding the reference position with a conductive pattern and forming solder on the conductive pattern so as to give the convex body an inner surface; and
   the step of placing the positioning member comprises providing the positioning member with an end having slanted edges, and guiding the slanted edges into contact with the inner surface of the convex body.

26. The method according to claim 25, wherein the step of surrounding comprises forming the conductive pattern in the shape of a ring.

27. The method according to claim 25, wherein the step of surrounding comprises forming the conductive pattern in the shape of a triangle.

28. The method according to claim 25, wherein the step of surrounding comprises forming the conductive pattern in the shape of a square.

29. The method according to claim 25, wherein the step of surrounding comprises arranging four rectangular strips of conductive material around the reference position in the shape of a square.

30. The method according to claim 25, wherein the step of surrounding comprises arranging four rectangular strips of conductive material radially symmetrically around the reference position.

31. The method according to claim 20, wherein the step of providing a convex body comprises locating a conductive pattern at the reference position, and forming a convex shape of solder on the conductive pattern; and the step of placing the positioning member comprises providing the positioning member with an end defining in the center a hole having slanted inner edges, and guiding the slanted inner edges into contact with the convex shape of solder.

* * * * *